(12) United States Patent
Lin et al.

(10) Patent No.: US 12,316,099 B2
(45) Date of Patent: May 27, 2025

(54) PROTECTION CIRCUIT FOR HIGH TEMPERATURE REVERSE BIAS TEST

(71) Applicant: INNOSCIENCE (SUZHOU) SEMICONDUCTOR CO., LTD., Suzhou (CN)

(72) Inventors: Yiming Lin, Suzhou (CN); Kai Hu, Suzhou (CN); Jianjian Sheng, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/923,597

(22) PCT Filed: Jun. 28, 2022

(86) PCT No.: PCT/CN2022/102008
§ 371 (c)(1),
(2) Date: Nov. 7, 2022

(87) PCT Pub. No.: WO2024/000186
PCT Pub. Date: Jan. 4, 2024

(65) Prior Publication Data
US 2024/0235183 A1   Jul. 11, 2024

(51) Int. Cl.
*H02H 7/20* (2006.01)
*G01R 31/28* (2006.01)

(52) U.S. Cl.
CPC ........... *H02H 7/20* (2013.01); *G01R 31/2849* (2013.01)

(58) Field of Classification Search
CPC .............................. H02H 7/20; G01R 31/2849
(Continued)

(56) References Cited

U.S. PATENT DOCUMENTS 5,563,759 A * 10/1996 Nadd ................. H03K 17/0822
361/103
7,535,283 B2 * 5/2009 Kojima ................ H03K 17/168
327/434
(Continued)

FOREIGN PATENT DOCUMENTS

CN       202794445 U     3/2013
CN       109406980 A     3/2019
(Continued)

OTHER PUBLICATIONS

ISA State Intellectual Property Office of the People's Republic of China, International Search Report Issued in Application No. PCT/CN2022/102008, Dec. 29, 2022, WIPO, 5 pages.
(Continued)

*Primary Examiner* — Dharti H Patel
(74) *Attorney, Agent, or Firm* — McCoy Russell LLP

(57) ABSTRACT

The present disclosure provides a protection circuit for protecting an electronic device under a high temperature reverse bias (HTRB) test, the protection circuit comprising: a switch configured to connect/disconnect the protection circuit to/from the electronic device based on a switching signal; a current-sensing circuit configured to sense a drain-source leakage current flowing through a drain-source junction of the electronic device and generate a current-sensing signal; and a driving circuit configured to receive the current-sensing signal from the current-sensing circuit and generate a driving signal for switching on/off the switch such that the drain-source leakage current is blocked by the switch when the current-sensing signal is higher than a reference voltage.

7 Claims, 7 Drawing Sheets

(58) Field of Classification Search
USPC .................................................. 361/101, 93.1
See application file for complete search history.

(56) References Cited

U.S. PATENT DOCUMENTS

| | | | | |
|---|---|---|---|---|
| 9,160,165 | B2* | 10/2015 | Cortigiani | ................. H02H 9/02 |
| 11,088,686 | B2* | 8/2021 | Suzuki | ................. G01R 15/181 |
| 11,955,957 | B2* | 4/2024 | Djelassi-Tscheck | ......................... H03K 17/0822 |
| 2002/0118500 | A1* | 8/2002 | Covi | ....................... H02H 3/087 361/93.7 |
| 2012/0099234 | A1* | 4/2012 | Inoue | ..................... H02M 1/08 361/87 |
| 2013/0135775 | A1* | 5/2013 | Yao | ......................... H02M 1/08 361/18 |
| 2013/0332750 | A1 | 12/2013 | Souma | |
| 2020/0052692 | A1* | 2/2020 | Suzuki | ................. H03K 17/567 |
| 2020/0341047 | A1* | 10/2020 | Suzuki | ................... G01R 31/26 |
| 2021/0167770 | A1* | 6/2021 | Suzuki | ................. G01R 15/181 |
| 2023/0187922 | A1* | 6/2023 | Randazzo | .............. H03K 19/20 361/87 |

FOREIGN PATENT DOCUMENTS

| | | | |
|---|---|---|---|
| CN | 111751695 | A | 10/2020 |
| CN | 113359000 | A | 9/2021 |
| CN | 214622914 | U | 11/2021 |
| CN | 114545139 | A | 5/2022 |
| CN | 114646873 | A | 6/2022 |
| CN | 219936019 | U * | 10/2023 |
| JP | 2022131200 | A * | 9/2022 |

OTHER PUBLICATIONS

ISA State Intellectual Property Office of the People's Republic of China, Written Opinion of the International Searching Authority Issued in Application No. PCT/CN2022/102008, Dec. 29, 2022, WIPO, 4 pages.

* cited by examiner

PROTECTION CIRCUIT FOR HIGH TEMPERATURE REVERSE BIAS TEST

FIELD OF THE INVENTION

The present invention generally relates to a high temperature reverse bias (HTRB) test on nitride-based semiconductor devices. More specifically, the present invention relates to protection circuit for high temperature reverse bias test on nitride-based semiconductor devices.

BACKGROUND OF THE INVENTION

Gallium nitride (GaN)-based devices have been widely used for high frequency electrical energy conversion systems because of low power losses and fast switching transition. In comparison with silicon metal oxide semiconductor field effect transistor (MOSFET), GaN high-electron-mobility transistor (HEMT) has a much better figure of merit and more promising performance for high-power and high-frequency applications.

High temperature reverse bias (HTRB) test is one of the important reliability tests for power devices. HTRB tests are designed to accelerate failure mechanisms that are thermally activated through the use of biased operating conditions. During a typical HTRB test, the device samples are stressed at or slightly less than the maximum rated reverse breakdown voltage at an ambient temperature close to their maximum rated junction temperature over an extended period. HTRB testing can provide invaluable insights into long-term stability and be useful for research and development, as well as product qualification.

HTRB tests often involve multiple devices under test (e.g., wafer level testing). The multiple devices are connected in parallel and applied by a same stressing voltage. When a device fails in a HTRB test, its drain-source junction may be short-circuited and a huge drain-source leakage current may be generated to further damage the transistor. This may complicate the failure modes and make failure analysis difficult. Conventionally, as shown in FIG. 1, each device under test (DUT) may be connected in series with a current-limiting resistor R (typically 1 MΩ) to reduce the leakage current in a passive manner. When the device is subjected to voltage stress supplied by a power supply (PS), a certain leakage current $I_{dss}$ will be generated, causing a voltage drop $V_R$ across the current limiting resistor R, which is given by: $V_R = I_{dss} \times R$.

For Si and SiC devices, the leakage current Idss at 150° C. which is the typical ambient temperature of HTRB test is in the order of 10 uA, resulting in a voltage drop in the order of 10V across the current limiting resistor. But for GaN devices, leakage current Idss at 150° C. is in the order of 10 uA~100 uA, resulting in a voltage drop in the order of 10~100V across the current limiting resistor which in turn reduce the stressing voltage applied to the device under test. To address this issue, one approach is to reduce the value of the current-limiting resistor, however, protection function will be lost and a large leakage current will flow when the device HTRB fails. Another approach is to increase the stressing voltage to compensate for the voltage drop due to leakage current. However, since different device may have different leakage currents under a same bias voltage, it would be very difficult to have an appropriate compensation voltage for a batch of device under test. If the compensation voltage is determined for the device with relatively small leakage current, the stressing voltage of the device with relatively large leakage current is still insufficient; if compensation voltage is determined for the device with relatively large leakage current, the device with relatively small leakage current will bear excessive stress. Therefore, for GaN devices, the existing method of connecting current limiting resistors in series with each device under test cannot simultaneously reserve the device failure modes when failing the HTRB test and ensure that all devices under test in a same batch are undergone a same HTRB stress. Therefore, it is essential to have a testing configuration with properly designed protection circuits to avoid damages to devices and equipment and test data loss.

SUMMARY OF THE INVENTION

In accordance with one aspect of the present disclosure, an active protection circuit for protecting an electronic device under a high temperature reverse bias (HTRB) test and a HTRB testing system including the active protection circuit are provided. The protection circuit comprising: a switch configured to connect/disconnect the active protection circuit to/from the electronic device based on a switching signal; a current-sensing circuit configured to sense a drain-source leakage current flowing through a drain-source junction of the electronic device and generate a current-sensing signal; and a driving circuit configured to receive the current-sensing signal from the current-sensing circuit and generate a driving signal for switching on/off the switch such that the drain-source leakage current is blocked by the switch when the current-sensing signal is higher than a reference voltage; wherein: the switch has a first conduction terminal connected to the electronic device; the current-sensing circuit has an input terminal connected to a second conduction terminal of the switch and a ground terminal connected to a negative terminal of a power supply and the driving circuit has an input terminal connected to an output terminal of the current-sensing circuit, a ground terminal connected to the negative terminal of a power supply, and an output terminal connected to a control terminal of the switch.

In accordance with another aspect of the present invention, a method for implementing a protection circuit for protecting an electronic device under a high temperature reverse bias (HTRB) test is provided. The method comprises: connecting a first conduction terminal of a switch to the electronic device; connecting an input terminal of a current-sensing circuit to a second conduction terminal of the switch; connecting a ground terminal of the current-sensing circuit to a negative terminal of a power supply; connecting an input terminal of a driving circuit to an output terminal of the current-sensing circuit; connecting a ground terminal of the driving circuit to the negative terminal of the power supply; connecting an output terminal of the driving circuit to a control terminal of the switch; configuring the switch to connect/disconnect the protection circuit to/from the electronic device based on a switching signal; configuring the current-sensing circuit to sense a drain-source leakage current flowing through a drain-source junction of the electronic device and generate a current-sensing signal; and configuring the driving circuit to receive the current-sensing signal from the current-sensing circuit and generate a driving signal for switching on/off the switch such that the drain-source leakage current is blocked by the switch when the current-sensing signal is higher than a reference voltage.

The provided active protection circuit can simultaneously reserve the device failure modes when failing the HTRB test without using large value current-limiting resistor. Leakage current induced large voltage drop can be avoided and uniformity of HTRB stress voltage on all devices under test in a same batch can be maintained. Moreover, the active protection circuit can be used to protect any single device and prevent its failure form interrupting HTRB test on other devices within the same batch. Therefore, efficiency and effectiveness of HTBR test can be improved.

BRIEF DESCRIPTION OF THE DRAWINGS

Aspects of the present disclosure may be readily understood from the following detailed description with reference to the accompanying figures. The illustrations may not necessarily be drawn to scale. That is, the dimensions of the various features may be arbitrarily increased or reduced for clarity of discussion. There may be distinctions between the artistic renditions in the present disclosure and the actual apparatus due to manufacturing processes and tolerances. Common reference numerals may be used throughout the drawings and the detailed description to indicate the same or similar components.

DETAILED DESCRIPTION

In the following description, preferred examples of the present disclosure will be set forth as embodiments which are to be regarded as illustrative rather than restrictive. Specific details may be omitted so as not to obscure the present disclosure; however, the disclosure is written to enable one skilled in the art to practice the teachings herein without undue experimentation.

Figure 1:
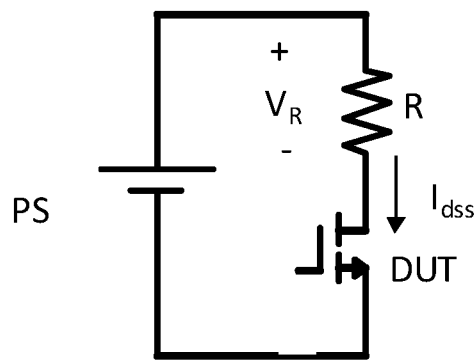
FIG. 1 shows a conventional protection circuit for a device under HTRB test.
Figure 2:
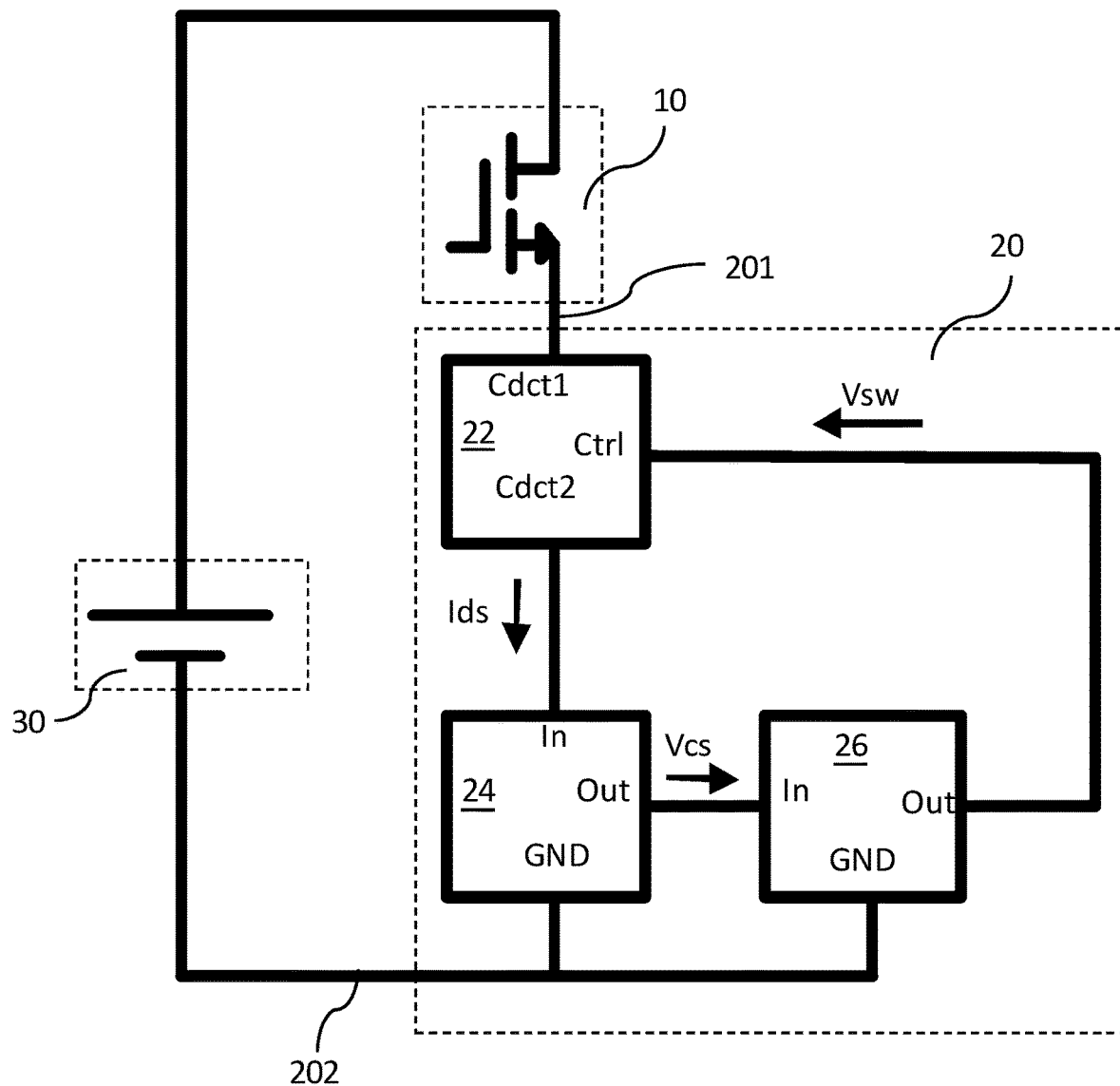
FIG. 2 shows a circuit block diagram for an active protection circuit for protecting an electronic device under a high temperature reverse bias (HTRB) test according to some embodiments of the present invention.

FIG. 2 shows a circuit block diagram for an active protection circuit 20 for protecting an electronic device 10 under a high temperature reverse bias (HTRB) test according to some embodiments of the present invention. As shown, the active protection circuit 20 may be coupled between the electronic device 10 and a power supply 30. The electronic device 10 may have a first conduction terminal Cdct1, a second conduction terminal Cdct1 and a control terminal Ctrl. In some embodiments, the DUT 10 may be a transistor having a gate G being the control terminal Ctrl, a source S being the first conduction terminal Cdct1 and a drain being the second conduction terminal Ccdt2.

The active protection circuit 20 may have a first terminal 201 connected to the first conduction terminal Ccdt1 of the electronic device 10 and a second terminal 202 connected to a negative terminal of the power supply 30.

The protection circuit 10 may comprise a switch 22 configured to connect/disconnect the protection circuit to/from the electronic device based on a switching signal Vsw. The protection circuit 10 may further comprise a current-sensing circuit 24 configured to sense a drain-source leakage current Ids flowing through a drain-source junction of the electronic device and generate a current-sensing signal Vcs. The protection circuit 10 may further comprise a driving circuit 26 configured to receive the current-sensing signal Vcs from the current-sensing circuit 24 and generate a driving signal Vsw for switching on/off the switch 22 such that the drain-source leakage current Ids is blocked by the switch when the current-sensing signal Vcs is higher than a reference voltage Vref.

The switch 22 may have a first conduction terminal Ccdt1 connected to the electronic device 10. The current-sensing circuit 24 may have an input terminal In connected to a second conduction terminal Ccdt2 of the switch 22 and a ground terminal GND connected to the negative terminal of a power supply 30. The driving circuit 26 may have an input terminal In connected to an output terminal Out of the current-sensing circuit 24, a ground terminal GND connected to the negative terminal of a power supply 30, and an output terminal Out connected to a control terminal Ctrl of the switch 22.

Figure 3A:
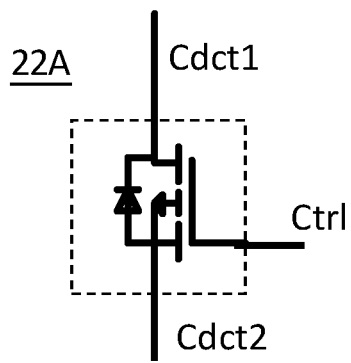
FIGS. 3A-3C shows various exemplary circuit diagrams of the switch according to some embodiments of the present invention.
Figure 3B:
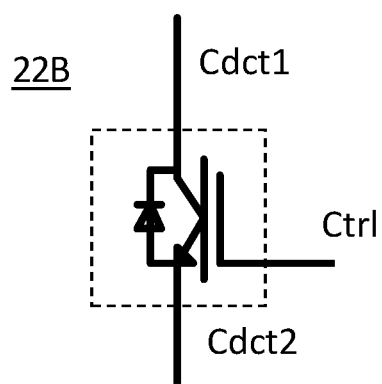
Figure 3C:
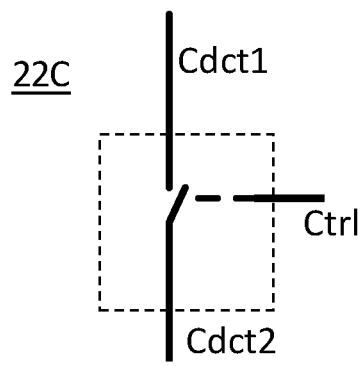

FIGS. 3A-3C shows various exemplary circuit diagrams of the switch 22 according to some embodiments of the present invention. As shown in FIG. 3A, the switch 22 may include a field effect transistor (FET) having a drain connected to the first conduction terminal of the switch 22, a source connected to the second conduction terminal Cdct2 of the switch 22 and a gate connected to the control terminal Ctrl of the switch 22. In some embodiments, the FET Q1 may be an enhancement-mode (E-mode) FET which is in an on state at zero gate-source voltage. In some embodiments, the FET may be depletion-mode (D-mode) FET which is in an off state at zero gate-source voltage.

As shown in FIG. 3B, the switch 22 may include an insulated gate bipolar transistor (IGBT) having a collector connected to the first conduction terminal of the switch 22, an emitter connected to the second conduction terminal Cdct2 of the switch 22 and a gate connected to the control terminal Ctrl of the switch 22.

As shown in FIG. 3C, the switch 22 may include a relay having a first contact connected to the first conduction terminal of the switch 22, a second contact connected to the second conduction terminal Cdct2 of the switch 22 and a control terminal connected to the control terminal Ctrl of the switch 22.

Figure 4:
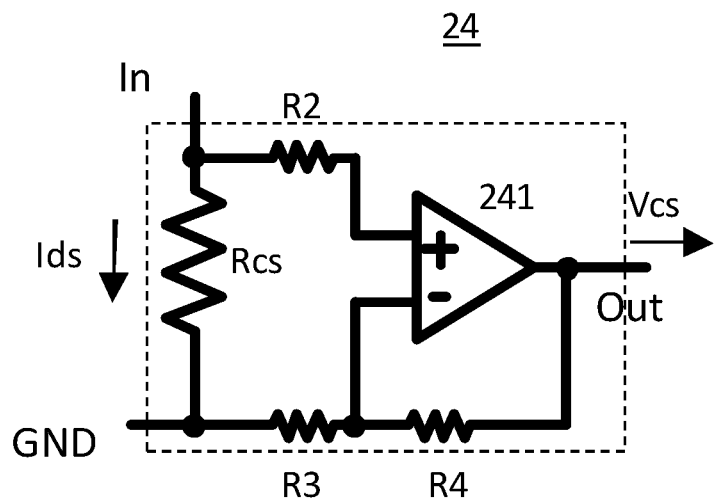
FIG. 4 shows an exemplary circuit diagram of the current-sensing circuit according to some embodiments of the present invention.

FIG. 4 shows an exemplary circuit diagram of the current-sensing circuit 24 according to some embodiments of the present invention. As shown, the current-sensing circuit 24 may include a first resistor R1 having a first end connected to the input terminal In of the current-sensing circuit 24, a second end connected to the ground terminal GND of the current-sensing circuit 24. The current-sensing circuit 24 may further include a second resistor R2 having a first end connected to the input terminal In of the current-sensing circuit 24. The current-sensing circuit 24 may further include a third resistor R3 having a first end connected to the ground terminal GND of the current-sensing circuit 24. The current-sensing circuit 24 may further include a fourth resistor R4 having a first end connected to a second end of the third resistor R3 and a second end connected to the output terminal Out of the current-sensing circuit 24. The current-sensing circuit 24 may further include a comparator 241 having a non-inverting input connected to a second end of the second resistor R2, an inverting input jointly connected to the second end of the third resistor R3 and the first end of fourth resistor R4, and an output connected to the output terminal Out of the current-sensing circuit 24.

Figure 5:
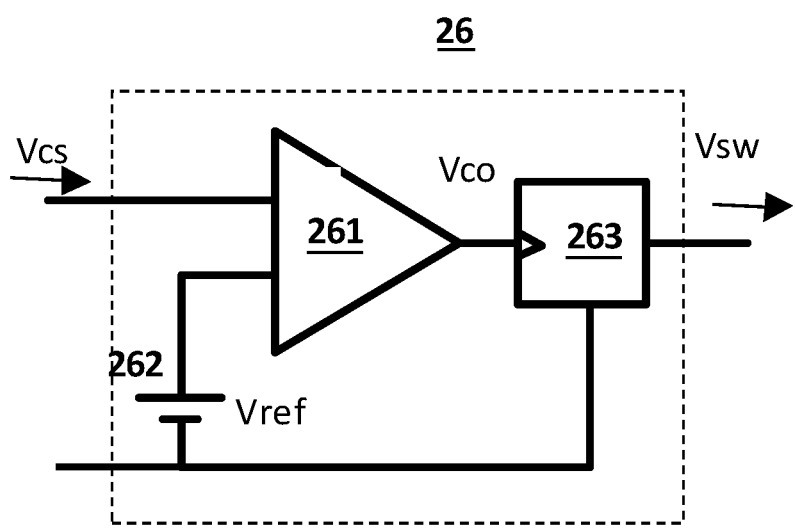
FIG. 5 shows an exemplary circuit diagram of the driving circuit according to some embodiments of the present invention.

FIG. 5 shows an exemplary circuit diagram of the driving circuit 26 according to some embodiments of the present invention. The driving circuit 26 may comprise a comparator 261 configured to receive the current-sensing signal Vcs and compare the current-sensing signal Vcs with the reference voltage Vref to generate a comparison output signal Vco. The driving circuit 26 may further comprise an internal reference voltage supply 262 configured to provide the reference voltage Vref to the comparator 261. The driving circuit 26 may further comprise a latch 263 configured to receive the comparison output signal Vco and generate the driving signal Vsw.

In the case that the switch 22 is a normally-off switch, the driving circuit 26 may be configured to generate a driving signal Vsw having a low-level value when the current-sensing signal has a high-level value and generate a driving signal Vsw having a high-level value when the current-sensing signal has a low-level value. That is, the driving circuit 26 may be configured to act as an inverting driver when the switch 22 is a normally-off switch.

Figure 6A:
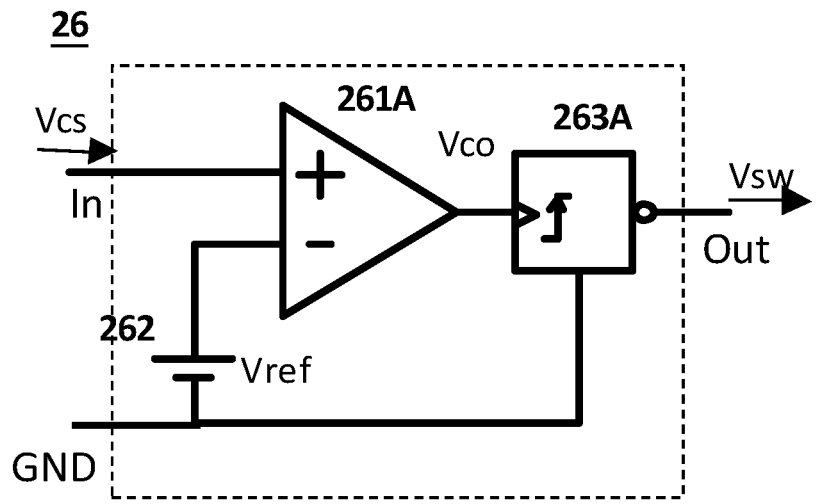
FIG. 6A depicts an exemplary circuit diagram of the driving circuit when it is configured to act as an inverting driver according to one embodiment of the present invention.

FIG. 6A depicts an exemplary circuit diagram of the driving circuit 26 when it is configured to act as an inverting driver according to one embodiment of the present invention. As shown, the driving circuit 26 may include a comparator 261A having a non-inverting (+) input terminal connected to the input terminal of the driving circuit 26 and an inverting (−) input terminal connected to the internal reference voltage supply 262. The driving circuit 26 may further include a rising-edge triggered latch 263A having a reset terminal connected to an output terminal of the comparator 261A and an inverted output terminal connected to the output terminal of the driving circuit 26.

Figure 6B:
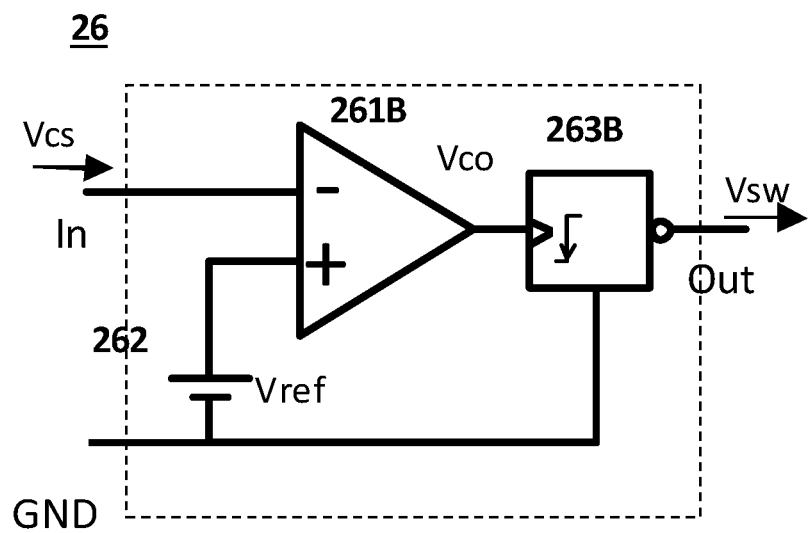
FIG. 6B depicts another exemplary circuit diagram of the driving circuit when it is configured to act as an inverting driver according to one embodiment of the present invention.

FIG. 6B depicts another exemplary circuit diagram of the driving circuit 26 when it is configured to act as an inverting driver according to one embodiment of the present invention. As shown, the driving circuit 26 may include a comparator 261B having an inverting (−) input terminal connected to the input terminal of the driving circuit 26 and an inverting (−) input terminal connected to the internal reference voltage supply 262. The driving circuit 26 may further include a falling-edge triggered latch 263B having a reset terminal connected to an output terminal of the comparator 261B and an inverted output terminal connected to the output terminal of the driving circuit 26.

In the case that the switch 22 is a normally-on switch, the driving circuit 26 may be configured to generate a driving signal Vsw having a low-level value when the current-sensing signal has a low-level value and generate a driving signal Vsw having a high-level value when the current-sensing signal has a high-level value. That is, the driving circuit 26 may be configured to act as a non-inverting driver when the switch 22 is a normally-on switch.

Figure 6C:
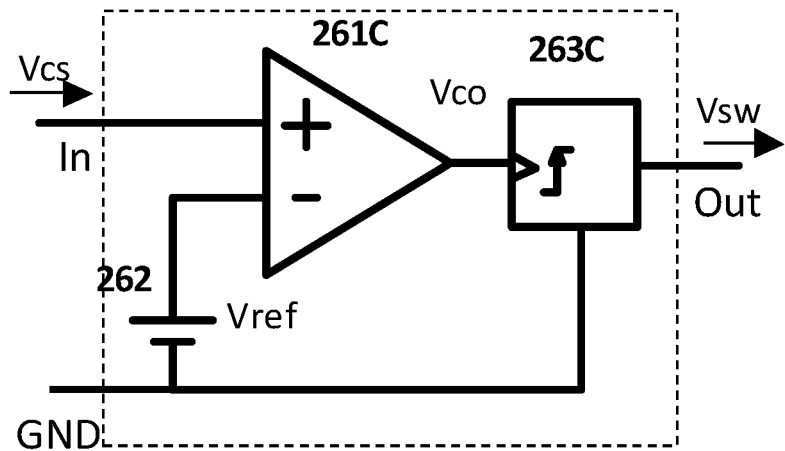
FIG. 6C depicts an exemplary circuit diagram of the driving circuit when it is configured to act as a non-inverting driver according to one embodiment of the present invention.

FIG. 6C depicts an exemplary circuit diagram of the driving circuit 26 when it is configured to act as a non-inverting driver according to one embodiment of the present invention. As shown, the driving circuit 26 may include a comparator 261C having a non-inverting (+) input terminal connected to the input terminal of the driving circuit 26 and an inverting (−) input terminal connected to the internal reference voltage supply 262. The driving circuit 26 may further include a rising-edge triggered latch 263C having a reset terminal connected to an output terminal of the comparator 261C and a non-inverting output terminal connected to the output terminal of the driving circuit 26.

Figure 6D:
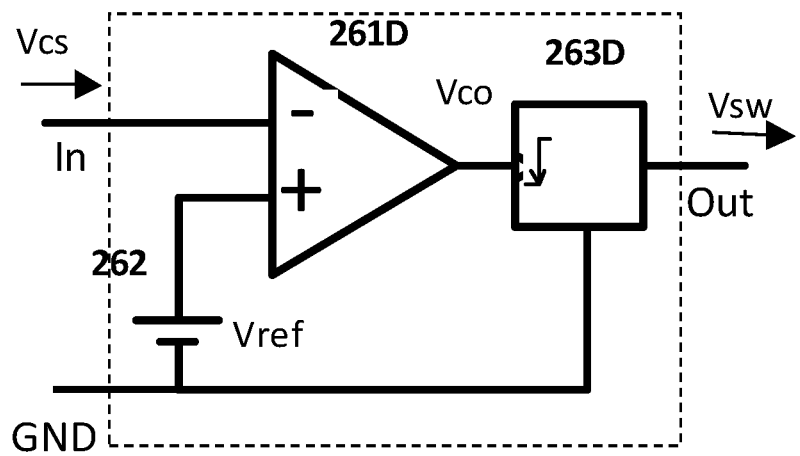
FIG. 6D depicts another exemplary circuit diagram of the driving circuit when it is configured to act as an inverting driver according to one embodiment of the present invention.

FIG. 6D depicts another exemplary circuit diagram of the driving circuit 26 when it is configured to act as an inverting driver according to one embodiment of the present invention. As shown, the driving circuit 26 may include a comparator 261D having an inverting (−) input terminal connected to the input terminal of the driving circuit 26 and an inverting (−) input terminal connected to the internal reference voltage supply 262. The driving circuit 26 may further include a falling-edge triggered latch 263D having a reset terminal connected to an output terminal of the comparator 261D and a non-inverting output terminal connected to the output terminal of the driving circuit 26.

Figure 7:
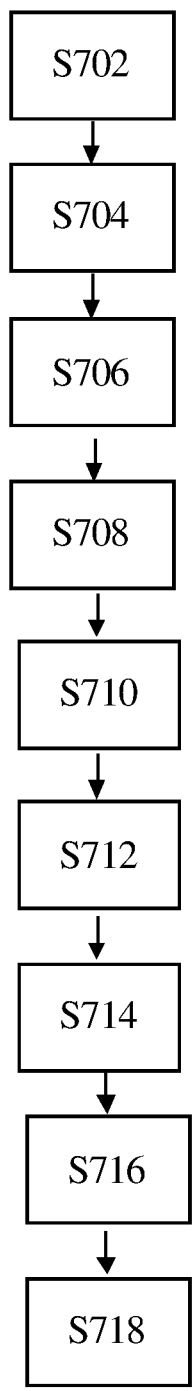
FIG. 7 is a flowchart illustrate a method for implementing a protection circuit for protecting an electronic device under a HTRB test according to some embodiments of the present invention.

FIG. 7 is a flowchart illustrate a method for implementing a protection circuit for protecting an electronic device under a HTRB test according to some embodiments of the present invention. As shown, the method may comprise: step S702: connecting a first conduction terminal of a switch to the electronic device; step S704: connecting an input terminal of a current-sensing circuit to a second conduction terminal of the switch; step S706: connecting a ground terminal of the current-sensing circuit to a negative terminal of a power supply; step S708: connecting an input terminal of a driving circuit to an output terminal of the current-sensing circuit; step S710: connecting a ground terminal of the driving circuit to the negative terminal of the power supply; step S712: connecting an output terminal of the driving circuit to a control terminal of the switch; step S714: configuring the switch to connect/disconnect the protection circuit to/from the electronic device based on a switching signal; step S716: configuring the current-sensing circuit to sense a drain-source leakage current flowing through a drain-source junction of the electronic device and generate a current-sensing signal; and step S718: configuring the driving circuit to receive the current-sensing signal from the current-sensing circuit and generate a driving signal for switching on/off the switch such that the drain-source leakage current is blocked by the switch when the current-sensing signal is higher than a reference voltage.

When the switch is a normally-off switch, the driving circuit may be configured by connecting a non-inverting input terminal of a comparator to an input terminal of the driving circuit; connecting an inverting input terminal of the comparator to an internal reference voltage; connecting a reset terminal of a rising-edge triggered latch to an output terminal of the comparator; and connecting an inverted output terminal of the rising-edge triggered latch to the output terminal of the driving circuit. Alternatively, the driving circuit may be configured by: connecting a non-inverting input terminal of a comparator to an internal reference voltage; connecting an inverting input terminal of the comparator to an input terminal of the driving circuit; connecting a reset terminal of a falling-edge triggered latch to an output terminal of the comparator; and connecting an inverted output terminal of the falling-edge triggered latch to the output terminal of the driving circuit.

When the switch is a normally-on switch, the driving circuit may be configured by: connecting a non-inverting input terminal of a comparator to an input terminal of the driving circuit; connecting an inverting input terminal of the comparator to an internal reference voltage; connecting a reset terminal of a rising-edge triggered latch to an output terminal of the comparator; and connecting a non-inverting output terminal of the rising-edge triggered latch to the output terminal of the driving circuit. Alternatively, the driving circuit may be configured by: connecting a non-inverting input terminal of a comparator to an internal reference voltage; connecting an inverting input terminal of the comparator to an input terminal of the driving circuit; connecting a reset terminal of a falling-edge triggered latch to an output terminal of the comparator; and connecting a non-inverting output terminal of the falling-edge triggered latch to the output terminal of the driving circuit.

The embodiments were chosen and described in order to best explain the principles of the invention and its practical application, thereby enabling others skilled in the art to understand the invention for various embodiments and with various modifications that are suited to the particular use contemplated. While the methods disclosed herein have been described with reference to particular steps performed in a particular order, it will be understood that these steps may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. A protection circuit for protecting an electronic device under a high temperature reverse bias (HTRB) test, the protection circuit comprising:
    a switch configured to connect/disconnect the protection circuit to/from the electronic device based on a switching signal;
    a current-sensing circuit configured to sense a drain-source leakage current flowing through a drain-source junction of the electronic device and generate a current-sensing signal; and
    a driving circuit configured to receive the current-sensing signal from the current-sensing circuit and generate a driving signal for switching on/off the switch, and when the current-sensing signal is higher than a reference voltage, the driving circuit is configured to transmit the driving signal to the switch to control the switch to disconnect the protection circuit from the electronic device, such that a drain source leakage current is blocked by the switch;
    wherein:
        the switch has a first conduction terminal connected to the electronic device;
        the current-sensing circuit has an input terminal connected to a second conduction terminal of the switch and a ground terminal connected to a negative terminal of a power supply; and
        the driving circuit has an input terminal connected to an output terminal of the current-sensing circuit, a ground terminal connected to the negative terminal of the power supply, and an output terminal connected to a control terminal of the switch;
    wherein the driving circuit comprises:
        a comparator configured to receive the current-sensing signal and compare the current-sensing signal with the reference voltage to generate a comparison output signal;
        an internal reference voltage supply configured to provide the reference voltage to the comparator; and
        a latch configured to receive the comparison output signal and generate the driving signal;
    wherein the switch is a normally-off switch;
    wherein the comparator of the driving circuit has a non-inverting input terminal connected to an input terminal of the driving circuit and an inverting input terminal connected to the internal reference voltage supply; and the latch of the driving circuit is a rising-edge triggered latch having a reset terminal connected to an output terminal of the comparator and an inverted output terminal connected to the output terminal of the driving circuit; or
    the comparator of the driving circuit has a non-inverting input terminal connected to the internal reference voltage supply and an inverting input terminal connected to an input terminal of the driving circuit; and the latch of the driving circuit is a falling-edge triggered latch having a reset terminal connected to an output terminal of the comparator and an inverted output terminal connected to the output terminal of the driving circuit.

2. The protection circuit according to claim 1, wherein the switch is an enhancement-mode field effect transistor.

3. A high temperature reverse bias (HTRB) testing system comprising the protection circuit according to claim 1.

4. A method for implementing a protection circuit for protecting an electronic device under a high temperature reverse bias (HTRB) test, comprising:
    connecting a first conduction terminal of a switch to the electronic device;
    connecting an input terminal of a current-sensing circuit to a second conduction terminal of the switch;
    connecting a ground terminal of the current-sensing circuit to a negative terminal of a power supply;
    connecting an input terminal of a driving circuit to an output terminal of the current-sensing circuit;
    connecting a ground terminal of the driving circuit to the negative terminal of the power supply;
    connecting an output terminal of the driving circuit to a control terminal of the switch;
    configuring the switch to connect/disconnect the protection circuit to/from the electronic device based on a switching signal;
    configuring the current-sensing circuit to sense a drain-source leakage current flowing through a drain-source junction of the electronic device and generate a current-sensing signal; and
    configuring the driving circuit to receive the current-sensing signal from the current-sensing circuit and generate a driving signal for switching on/off the switch, and when the current-sensing signal is higher than a reference voltage, configuring the driving circuit to transmit the driving signal to the switch to control the switch to disconnect the protection circuit from the electronic device, such that a drain source leakage current is blocked by the switch;

wherein the switch is a normally-off switch, and the driving circuit is configured by:
connecting a non-inverting input terminal of a comparator to an input terminal of the driving circuit; connecting an inverting input terminal of the comparator to an internal reference voltage; connecting a reset terminal of a rising-edge triggered latch to an output terminal of the comparator; and connecting an inverted output terminal of the rising-edge triggered latch to the output terminal of the driving circuit; or,
connecting a non-inverting input terminal of a comparator to an internal reference voltage; connecting an inverting input terminal of the comparator to an input terminal of the driving circuit; connecting a reset terminal of a falling-edge triggered latch to an output terminal of the comparator; and connecting an inverted output terminal of the falling-edge triggered latch to the output terminal of the driving circuit.

5. A protection circuit for protecting an electronic device under a high temperature reverse bias (HTRB) test, the protection circuit comprising:
a switch configured to connect/disconnect the protection circuit to/from the electronic device based on a switching signal;
a current-sensing circuit configured to sense a drain-source leakage current flowing through a drain-source junction of the electronic device and generate a current-sensing signal; and
a driving circuit configured to receive the current-sensing signal from the current-sensing circuit and generate a driving signal for switching on/off the switch, and when the current-sensing signal is higher than a reference voltage, the driving circuit is configured to transmit the driving signal to the switch to control the switch to disconnect the protection circuit from the electronic device, such that a drain source leakage current is blocked by the switch;
wherein:
the switch has a first conduction terminal connected to the electronic device;
the current-sensing circuit has an input terminal connected to a second conduction terminal of the switch and a ground terminal connected to a negative terminal of a power supply; and
the driving circuit has an input terminal connected to an output terminal of the current-sensing circuit, a ground terminal connected to the negative terminal of the power supply, and an output terminal connected to a control terminal of the switch;
wherein the driving circuit comprises:
a comparator configured to receive the current-sensing signal and compare the current-sensing signal with the reference voltage to generate a comparison output signal;
an internal reference voltage supply configured to provide the reference voltage to the comparator; and
a latch configured to receive the comparison output signal and generate the driving signal;
wherein the switch is a normally-on switch;
wherein the comparator of the driving circuit has a non-inverting input terminal connected to an input terminal of the driving circuit and an inverting input terminal connected to the internal reference voltage supply; and the latch of the driving circuit is a rising-edge triggered latch having a reset terminal connected to an output terminal of the comparator and a non-inverting output terminal connected to the output terminal of the driving circuit; or
the comparator of the driving circuit has a non-inverting input terminal connected to the internal reference voltage supply and an inverting input terminal connected to an input terminal of the driving circuit; and the latch of the driving circuit is a falling-edge triggered latch having a reset terminal connected to an output terminal of the comparator and a non-inverting output terminal connected to the output terminal of the driving circuit.

6. The protection circuit according to claim 5, wherein the switch is a depletion-mode field effect transistor.

7. A high temperature reverse bias (HTRB) testing system comprising the protection circuit according to claim 5.

* * * * *